(12) United States Patent
Hoell, Jr. et al.

(10) Patent No.: US 12,557,251 B1
(45) Date of Patent: Feb. 17, 2026

(54) CHASSIS FOR ELECTRONIC DEVICE

(71) Applicant: Brunswick Corporation, Mettawa, IL (US)

(72) Inventors: Joseph A. Hoell, Jr., Dunbarton, NH (US); Matthew M. Reggio, Dover, NH (US); Benjamin C. Shaffer, Bedford, NH (US)

(73) Assignee: Brunswick Corporation, Mettawa, IL (US)

( * ) Notice: Subject to any disclaimer, the term of this patent is extended or adjusted under 35 U.S.C. 154(b) by 237 days.

(21) Appl. No.: 18/314,385

(22) Filed: May 9, 2023

(51) Int. Cl.
*H05K 7/20* (2006.01)

(52) U.S. Cl.
CPC .................... *H05K 7/209* (2013.01)

(58) Field of Classification Search
CPC ........ H05K 7/209; H05K 7/20; H05K 7/2089; F28F 9/002; F28F 2215/00; F28F 2215/02; F28F 2215/04; F28F 2215/10; F28F 2225/06
USPC .......................................... 165/80.3; 320/107
See application file for complete search history.

(56) References Cited

U.S. PATENT DOCUMENTS

| | | | | |
|---|---|---|---|---|
| 3,566,959 | A * | 3/1971 | Koltuniak | F28F 1/16 174/16.3 |
| 4,729,428 | A * | 3/1988 | Yasutake | F28F 13/12 165/166 |
| 5,311,928 | A * | 5/1994 | Marton | H01L 23/3672 174/16.3 |
| 5,358,032 | A * | 10/1994 | Arai | F28F 3/022 174/16.3 |
| 5,486,980 | A * | 1/1996 | Jordan | H05K 7/20909 257/722 |
| 5,710,694 | A * | 1/1998 | Chen | H01L 23/4006 174/16.3 |
| 5,881,800 | A * | 3/1999 | Chung | H01L 23/4093 165/185 |
| 6,015,008 | A * | 1/2000 | Kogure | H01L 23/3672 257/722 |
| 6,189,601 | B1 * | 2/2001 | Goodman | F28F 1/22 165/104.33 |

(Continued)

FOREIGN PATENT DOCUMENTS

CN   112003487 A   * 11/2020   ............ H02M 7/003

OTHER PUBLICATIONS

Demirjian et al., "Waterproof Marine Power Supply System with Integrated Convection Passage," U.S. Appl. No. 17/679,664, filed Feb. 24, 2022 (drawings, specification, and claims only).

(Continued)

*Primary Examiner* — Claire E Rojohn, III
(74) *Attorney, Agent, or Firm* — Andrus Intellectual Property Law, LLP

(57) ABSTRACT

A chassis for an electronic device is provided. The chassis extends in a longitudinal direction and is defined in a lateral direction perpendicular to the longitudinal direction. The chassis includes a bottom surface extending in the longitudinal direction, and multiple fins projecting downwardly from the bottom surface and extending in the longitudinal direction. The chassis further includes a slot extending in the lateral direction through the fins so as to allow air to flow along the chassis in the longitudinal direction in between the fins and in the lateral direction through the first slot.

20 Claims, 7 Drawing Sheets

(56) References Cited

U.S. PATENT DOCUMENTS

| | | | | |
|---|---|---|---|---|
| 6,301,779 | B1* | 10/2001 | Azar | H01L 23/3672 |
| | | | | 257/E23.103 |
| 6,310,776 | B1* | 10/2001 | Byrne | H01L 23/467 |
| | | | | 174/16.3 |
| 6,342,775 | B1* | 1/2002 | Sleder, Sr. | H02J 7/02 |
| | | | | 320/117 |
| 6,446,708 | B1* | 9/2002 | Lai | H01L 23/3672 |
| | | | | 165/185 |
| 6,945,319 | B1* | 9/2005 | Li | F28F 1/32 |
| | | | | 165/185 |
| 7,315,450 | B2* | 1/2008 | Ishii | H05K 7/20918 |
| | | | | 174/16.3 |
| 7,367,382 | B2* | 5/2008 | Miyazawa | H01L 23/467 |
| | | | | 257/E23.102 |
| 7,643,293 | B2* | 1/2010 | Chu | F28D 15/0275 |
| | | | | 361/679.48 |
| 7,794,116 | B2* | 9/2010 | Shuai | F21V 29/76 |
| | | | | 362/249.02 |
| 8,439,543 | B2* | 5/2013 | Tanaka | F21S 45/48 |
| | | | | 362/547 |
| 8,490,680 | B2* | 7/2013 | Shen | F28F 1/325 |
| | | | | 165/181 |
| 8,663,575 | B2* | 3/2014 | Maurer | G01N 21/0332 |
| | | | | 422/50 |
| 8,939,683 | B1* | 1/2015 | White | H01L 21/4878 |
| | | | | 407/62 |
| 9,581,321 | B2* | 2/2017 | Peck | F21V 3/00 |
| 9,791,142 | B2* | 10/2017 | Favarolo | F21V 7/005 |
| 9,879,849 | B2* | 1/2018 | Kinnune | F21V 29/83 |
| 10,080,311 | B1* | 9/2018 | Musiol | H05K 7/14 |
| 11,611,226 | B1 | 3/2023 | Shaffer et al. | |
| 11,870,329 | B2* | 1/2024 | Wu | H02K 9/227 |
| 2002/0195229 | A1* | 12/2002 | Hsieh | F28F 3/04 |
| | | | | 257/722 |
| 2003/0002258 | A1* | 1/2003 | Manabe | H01L 23/4093 |
| | | | | 248/510 |
| 2004/0035554 | A1* | 2/2004 | Sato | H01L 23/3677 |
| | | | | 29/890.035 |
| 2007/0047206 | A1* | 3/2007 | Lee | H01L 23/427 |
| | | | | 257/E23.099 |
| 2007/0246189 | A1* | 10/2007 | Lin | H01L 23/467 |
| | | | | 257/E23.102 |
| 2007/0258210 | A1* | 11/2007 | Xia | H01L 23/467 |
| | | | | 257/E23.099 |
| 2009/0310310 | A1* | 12/2009 | Anzai | H01L 24/75 |
| | | | | 165/185 |
| 2011/0013402 | A1* | 1/2011 | Little, Jr. | F21V 29/83 |
| | | | | 313/45 |
| 2014/0369054 | A1* | 12/2014 | Tsou | F21V 29/767 |
| | | | | 165/185 |
| 2015/0077043 | A1* | 3/2015 | Seidel | H02J 7/0045 |
| | | | | 320/107 |
| 2015/0208547 | A1* | 7/2015 | Gonzalez | H05K 7/20154 |
| | | | | 165/86 |
| 2018/0192545 | A1* | 7/2018 | Chen | H05K 7/20409 |
| 2019/0021186 | A1* | 1/2019 | Poltorak | F28F 13/12 |
| 2019/0357388 | A1* | 11/2019 | Sato | H05K 7/20409 |
| 2019/0394903 | A1* | 12/2019 | Chang | B21D 53/022 |
| 2020/0021005 | A1* | 1/2020 | Kosaka | H01Q 1/42 |
| 2021/0180873 | A1* | 6/2021 | Lin | F28D 15/0233 |
| 2021/0321537 | A1* | 10/2021 | Cousineau | F28D 15/0233 |
| 2021/0400850 | A1* | 12/2021 | Zhong | H02M 7/003 |
| 2022/0177101 | A1 | 6/2022 | Taylor | |
| 2023/0164962 | A1* | 5/2023 | Sun | H05K 7/20936 |
| | | | | 361/700 |
| 2023/0268261 | A1* | 8/2023 | Xu | H01L 23/49827 |
| | | | | 257/686 |
| 2023/0320035 | A1* | 10/2023 | Gregory | H01L 23/3672 |
| | | | | 165/80.3 |
| 2023/0363121 | A1* | 11/2023 | Xu | H01L 23/367 |

OTHER PUBLICATIONS

Victron Energy BV, "ARGO Diode Battery Isolators," Admitted Prior Art, The Netherlands, 1 page.

Hoell et al., Declaration of Prior Art.

Genesis Systems, Battery Isolator Blueprints, 2021.

* cited by examiner

CHASSIS FOR ELECTRONIC DEVICE

FIELD

The present disclosure relates generally to electronic devices, and more particularly to thermal management of such devices.

BACKGROUND

The following U.S. Patent Publication provides background information and is incorporated herein by reference in its entirety.

U.S. Patent Publication No. 2022/0177101 discloses a marine propulsion system for a marine vessel that includes a marine propulsion device, a plurality of power storage devices, and a charge distribution circuit. The marine propulsion device includes an engine and an alternator driven by the engine to generate a charge current. The plurality of power storage devices includes at least a first power storage device and a second power storage device, wherein each power storage device is configured to receive current from the alternator. The charge distribution circuit is positioned between the alternator and the plurality of power storage devices and includes an isolator configured to isolate the first power storage device from the second power storage device, a charge sensor configured to sense a charge level of the first power storage device, and a relay configured to connect and disconnect the second power storage device to/from the alternator based on the sensed charge level.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

According to one example of the present disclosure, a chassis for an electronic device is provided. The chassis extends in a longitudinal direction and is defined in a lateral direction perpendicular to the longitudinal direction. The chassis includes a bottom surface extending in the longitudinal direction; a first plurality of fins projecting downwardly from the bottom surface and extending in the longitudinal direction, and a first slot extending in the lateral direction through the first plurality of fins so as to allow air to flow along the chassis in the longitudinal direction in between the fins in the first plurality of fins and in the lateral direction through the first slot.

In one example, a first fin projects outwardly from a first lateral side of the chassis. In such an example, the first slot extends at least partway through the first fin.

In one example, a second fin projects outwardly from an opposite second lateral side of the chassis. In such an example, the first slot extends at least partway through the second fin.

In one example, the first fin is one of a second plurality of fins projecting outwardly from the first lateral side of the chassis, the second fin is one of a third plurality of fins projecting outwardly from the second lateral side of the chassis, and a lowermost fin in the second plurality of fins and a lowermost fin in the third plurality of fins are situated vertically lower than a lowermost extent of the fins in the first plurality of fins.

In one example, the first fin is the lowermost fin in the second plurality of fins and the second fin is the lowermost fin in the third plurality of fins.

In one example, the fins in the second plurality of fins decrease in lateral width from the lowermost fin to an uppermost fin thereof and the fins in the third plurality of fins decrease in lateral width from the lowermost fin to an uppermost fin thereof.

In one example, the chassis includes a second slot extending in the lateral direction through the first plurality of fins so as to allow air to flow along the chassis in the longitudinal direction in between the fins in the first plurality of fins and in the lateral direction through the second slot. In such an example, the second slot is spaced apart from the first slot in the longitudinal direction.

In one example, the chassis further includes a third slot extending in the lateral direction through the first plurality of fins. In such an example, the third slot is located between the first and second slots, so as to allow air to flow beneath the bottom surface of the chassis via the third slot, thereafter in the longitudinal direction in between the fins in the first plurality of fins, and thereafter in the lateral direction through the first and second slots.

In one example, the first slot extends vertically from a lowermost extent of the fins in the first plurality of fins to the bottom surface of the chassis.

In one example, the electronic device is a battery isolator.

According to another example of the present disclosure, a chassis for an electronic device is provided. The chassis includes a bottom side extending in a longitudinal direction and configured to support the electronic device. The chassis further includes a first plurality of fins projecting downwardly from the bottom side and extending in the longitudinal direction and a first slot extending in a lateral direction perpendicular to the longitudinal direction through the first plurality of fins such that the fins in the first plurality of fins are discontinuous in the longitudinal direction.

In one example, the chassis includes a first lateral side coupled to the bottom side and extending in the longitudinal direction and a second lateral side coupled to the bottom side opposite the first lateral side and extending in the longitudinal direction. A second plurality of fins projects outwardly from the first lateral side and extends in the longitudinal direction and a third plurality of fins projects outwardly from the second lateral side and extends in the longitudinal direction. The first slot extends at least partway through a fin in the second plurality of fins and at least partway through a fin in the third plurality of fins.

In one example, a lowermost fin in the second plurality of fins and a lowermost fin in the third plurality of fins are situated vertically lower than a lowermost extent of the fins in the first plurality of fins.

In one example, the first slot extends vertically from a lowermost extent of the fins in the first plurality of fins to a lower surface of the bottom side of the chassis.

In one example, a second slot extends in the lateral direction through the first plurality of fins. In such an example, the second slot is spaced apart from the first slot in the longitudinal direction. The chassis further includes a third slot extending in the lateral direction through the first plurality of fins. The third slot is located between the first and second slots.

According to another example of the present disclosure, a chassis for an electronic device is defined in a longitudinal direction and a lateral direction perpendicular to the longitudinal direction. The chassis comprises a bottom side extending in the longitudinal direction and the lateral direction and being configured to support the electronic device. A plurality of fins projects downwardly from the bottom side, the plurality of fins defining a plurality of airflow channels therebetween. The plurality of airflow channels are configured so as to allow air to flow along the bottom side of the chassis in the longitudinal direction and thereafter in the lateral direction.

In one example, the plurality of airflow channels are discontinuous in the longitudinal direction.

In one example, a slot extends in the lateral direction through the plurality of fins so as to allow air to flow in the lateral direction.

In one example, at least one fin in the plurality of fins turns from extending in the longitudinal direction to extending generally in the lateral direction.

In one example, the plurality of fins comprises mounting fins projecting downwardly from opposite lateral sides of the bottom side and the plurality of airflow channels extend through the mounting fins.

Various other features, objects, and advantages of the invention will be made apparent from the following description taken together with the drawings.

BRIEF DESCRIPTION OF THE DRAWINGS

The present disclosure is described with reference to the following Figures. The same numbers are used throughout the Figures to reference like features and like components.

DETAILED DESCRIPTION

Figure 1:
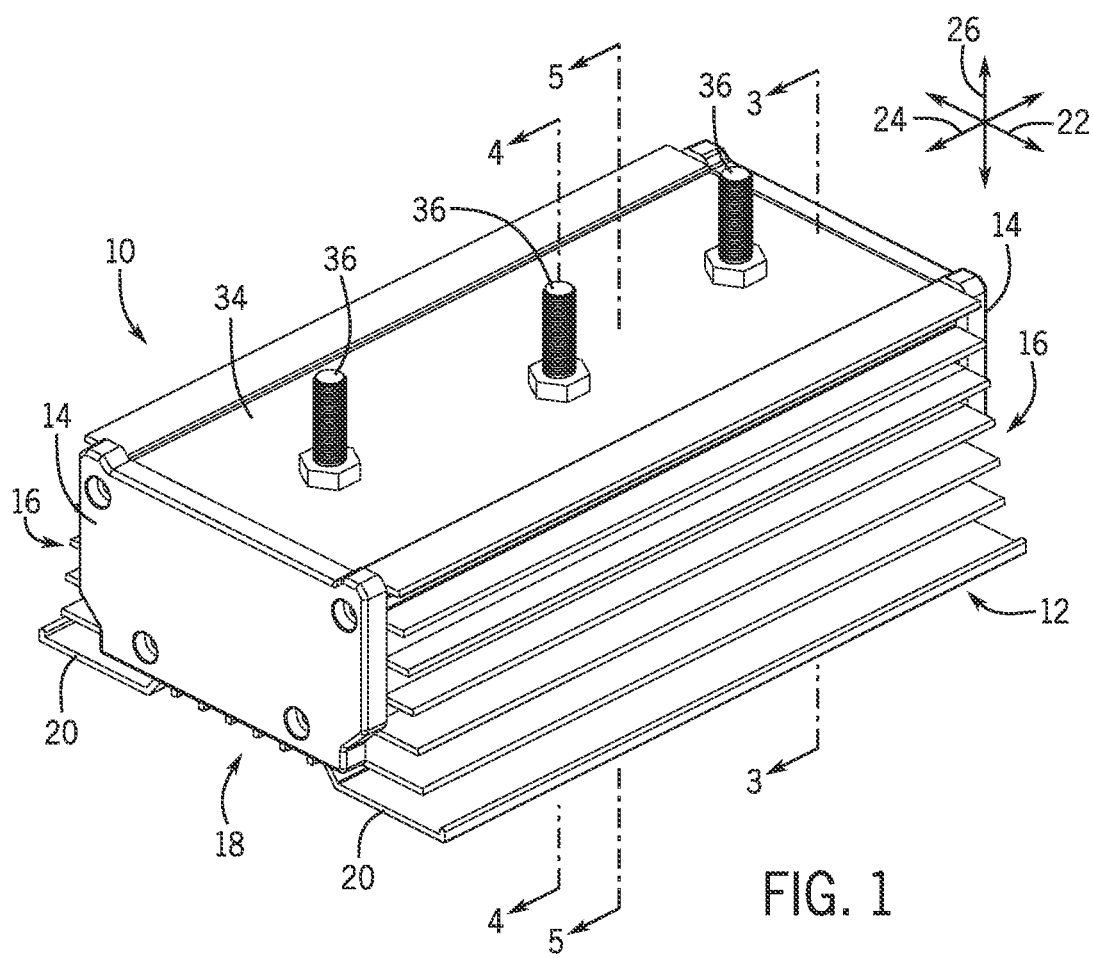
FIG. 1 illustrates a perspective view of the top of an exemplary battery isolator according to the present disclosure.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Unless otherwise specified or limited, the phrases "at least one of A, B, and C," "one or more of A, B, and C," and the like, are meant to indicate A, or B, or C, or any combination of A, B, and/or C, including combinations with multiple instances of A, B, and/or C. Likewise, unless otherwise specified or limited, the terms "mounted," "connected," "linked," "supported," and "coupled" and variations thereof are used broadly and encompass both direct and indirect mountings, connections, supports, and couplings. Further, unless otherwise specified or limited, "connected" and "coupled" are not restricted to physical or mechanical connections or couplings.

As used herein, unless otherwise limited or defined, discussion of particular directions is provided by example only, with regard to particular embodiments or relevant illustrations. For example, discussion of "top," "bottom," "front," "back," "left," "right," "lateral" or "longitudinal" features is generally intended as a description only of the orientation of such features relative to a reference frame of a particular example or illustration. Correspondingly, for example, a "top" feature may sometimes be disposed below a "bottom" feature (and so on), in some arrangements or embodiments. Additionally, use of the words "first," "second", "third," etc. is not intended to connote priority or importance, but merely to distinguish one of several similar elements from another.

The present inventors have recognized that many electronic devices, for example, diode-based battery isolators, contain electronic components that dissipate a significant amount of heat during their operation. The dissipated heat must be managed in order to prolong the lifespan of the devices, to reduce touch temperatures, and to prevent damage to the surrounding environment in which the device is located or mounted. Often, a cooling capacity of the chassis or enclosure for the electronic device is managed by increasing the surface area of the chassis via the addition of finned surfaces (i.e., passive cooling), through the use of a fan (i.e., active cooling), or both. However, the inclusion of additional finned surfaces on a chassis may reach a point where the additional surface area provided by the fins is neither thermally efficient nor practically or aesthetically desirable, and the use of fans may compromise sealing required to protect electronic devices against damage due to water intrusion. In addition, fans add significant complexity and cost to an electronic device.

The present inventors have recognized and solved these problems in the exemplary passively-cooled chassis for battery isolators disclosed herein. Existing battery isolators are often mounted in horizontal configurations in which the longest dimension of the chassis for the isolator is parallel to the horizontal mounting surface. By way of non-limiting example, this is the case in marine applications in which the battery isolator is mounted on the boat's deck. Because the hottest surfaces of the isolator chassis are generally the bottommost fins that extend downward toward the horizontal mounting surface, such an arrangement meant that air stagnated around the bottommost fins, and the chassis was not effectively cooled around these fins and the horizontal mounting surface. The present inventors have therefore modified the typically existing fins of a battery isolator chassis such that a "convection chimney" is formed through the fins and cooling is increased. Advantageously, the chimney solution comprises provision of one or more slots within the fins, and therefore an increase in cooling is achieved without adding weight or significant cost to the chassis. Although the examples depicted in the FIGURES and discussed herein specifically relate to battery isolators, the solutions disclosed are not limited to such devices, and could be utilized in many other types of passively cooled electronic devices. Such other types of passively cooled electronic devices include, but are not limited to, battery chargers, transformers, routers, stereo systems, and LED lighting components. In one example, the passively cooled electronic device may be a marine power supply system as described in U.S. patent application Ser. No. 17/679,664, which is hereby incorporated by reference herein.

FIGS. 1-6 depict a diode-based battery isolator device 10 according to an exemplary implementation of the present disclosure. The device 10 is shown to include a chassis 12 that extends in a lateral direction 22, longitudinal direction 24, and vertical direction 26. The chassis 12 is generally configured to house and manage the heat generated by the typical components of a diode-based battery isolator device. In a battery system containing multiple batteries, a battery isolator may be located between a starter battery and a backup battery to disconnect a battery from a power system for charging or discharging purposes, often to protect a secondary or backup battery from unnecessary drain. Because diodes permit electrical current to flow in only one direction, a diode-based battery isolator permits batteries to receive a charge off an external power source (e.g., shore power, for a marine battery system) while preventing the batteries from draining each other. Accordingly, as shown in FIG. 1, the diode-based battery isolator 10 includes three terminals 36 extending through a top cover 34, with two of the terminals 36 configured to connect to a battery and the remaining terminal 36 configured to connect a common connection, such that power can flow to the common connection but not backward. End caps 14 are shown to be located at both ends of the chassis 12 in the longitudinal direction 24, and aid the chassis 12 and the top cover 34 in encapsulating the internal electronic components of the isolator device 10.

Figure 3:
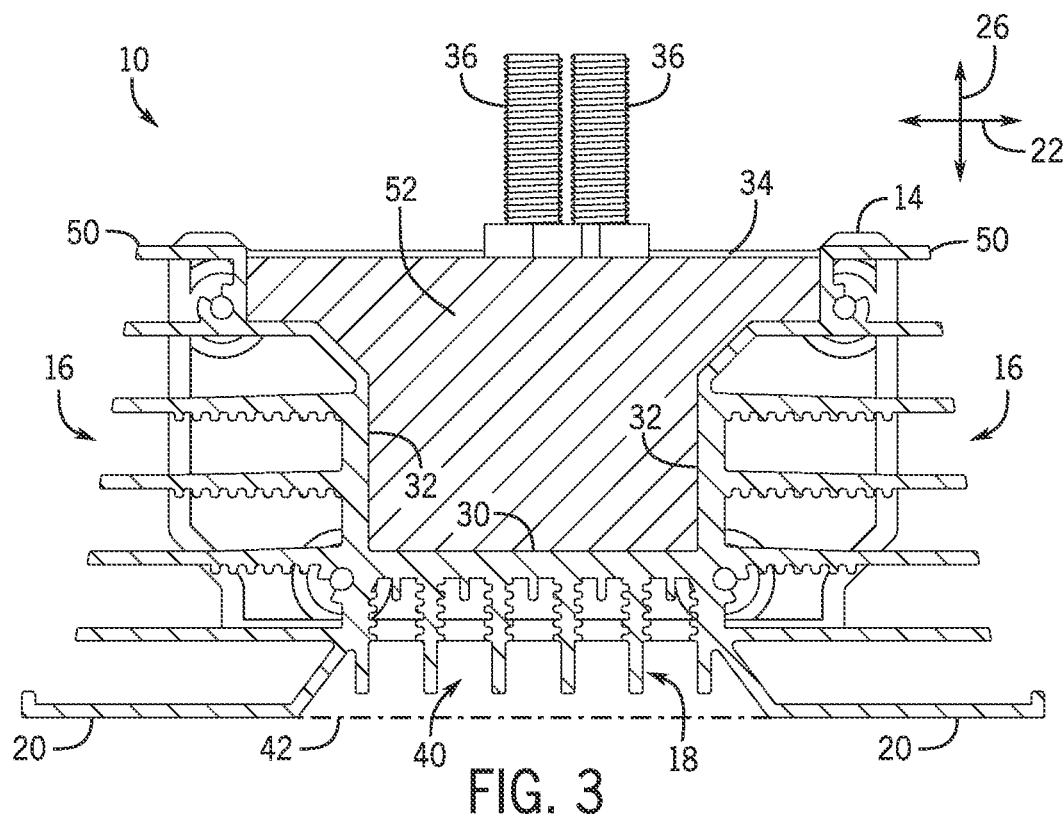
FIG. 3 illustrates a cross-sectional view of the battery isolator taken along the line 3-3 of FIG. 1.

The chassis 12 is shown to include multiple sets of finned surfaces 16, 18 that increase the overall surface area of the chassis 12 and therefore improve conduction and convection cooling of the device 10. As best shown in FIG. 3, sidewall fins 16 are shown to extend in the lateral direction 22 from sidewalls 32, and bottom wall fins 18 extend in the vertical direction 26 from the bottom wall 30. The sidewall fins 16 and bottom wall fins 18 are provided with sawtooth-like projections that further increase the surface area of the fins 16, 18. Together, the bottom wall 30 and sidewalls 32 define an interior region 52 of the chassis 12 that can be utilized to house and mount the internal components of the battery isolator device 10.

The present inventors have selected certain dimensions of the fins 16, 18 to achieve the purposes of the invention, namely, an increase in longitudinal and vertical airflow circulation around the chassis 12 and particularly in the region surrounding the bottom wall fins 18. This is because the electronic components within the interior region 52 that dissipate the most heat may be mounted around or directly sunk into the bottom wall 30, thus the heat generated by these components is largely conducted downward through the bottom wall fins 18. Unlike many existing battery isolator chassis, the bottom wall fins 18 of the chassis 12 extend some distance in the vertical direction 26, but do not fully extend to the lowermost vertical extent of the chassis 12 (indicated by line 42) and the lowermost, or mounting sidewall fins 20. In this way, a gap region 40 is formed below the bottom wall fins 18, allowing cooling air to travel in the lateral direction 22 around the fins 18, as well as along the longitudinal direction 24, as will be described in further detail herein with reference to FIG. 6. This is in contrast to many prior art designs, in which the bottom wall fins 18 extend vertically downwardly as far as the mounting sidewall fins 20, which prevents lateral airflow.

The sidewall and bottom wall fins 16, 18 are further shown to extend generally continuously in the longitudinal direction 24, although, as described in further detail below, a convection chimney or slot 28 extends through a portion of both the sidewall fins 16 and bottom wall fins 18. By including fins 16, 18 that extend generally continuously in the longitudinal direction 24, an attractive aesthetic appearance is provided by the chassis 12, and the process required to manufacture the chassis 12 is simpler. The attractive aesthetic appearance of the chassis 12 is further improved by tapering the amount that the side wall fins 16 extend in the lateral direction 22 (best shown in FIG. 3), such that the mounting fins 20 extend the greatest amount in the lateral direction 22, and the uppermost fins 50 extend the least amount in the lateral direction 22. Since the electronic components that dissipate the most heat are located closer to the mounting fins 20, such an arrangement also decreases the amount of material required to fabricate the chassis 12 without significantly compromising cooling function.

Figure 2:
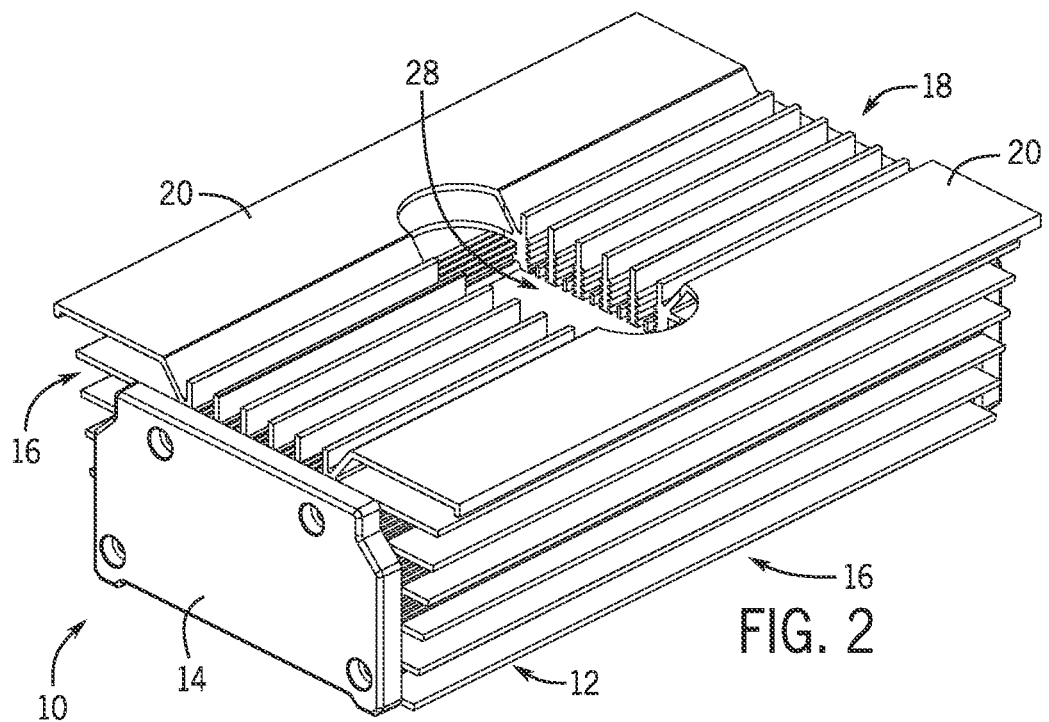
FIG. 2 illustrates a perspective view of the bottom of the battery isolator of FIG. 1.
Figure 4:
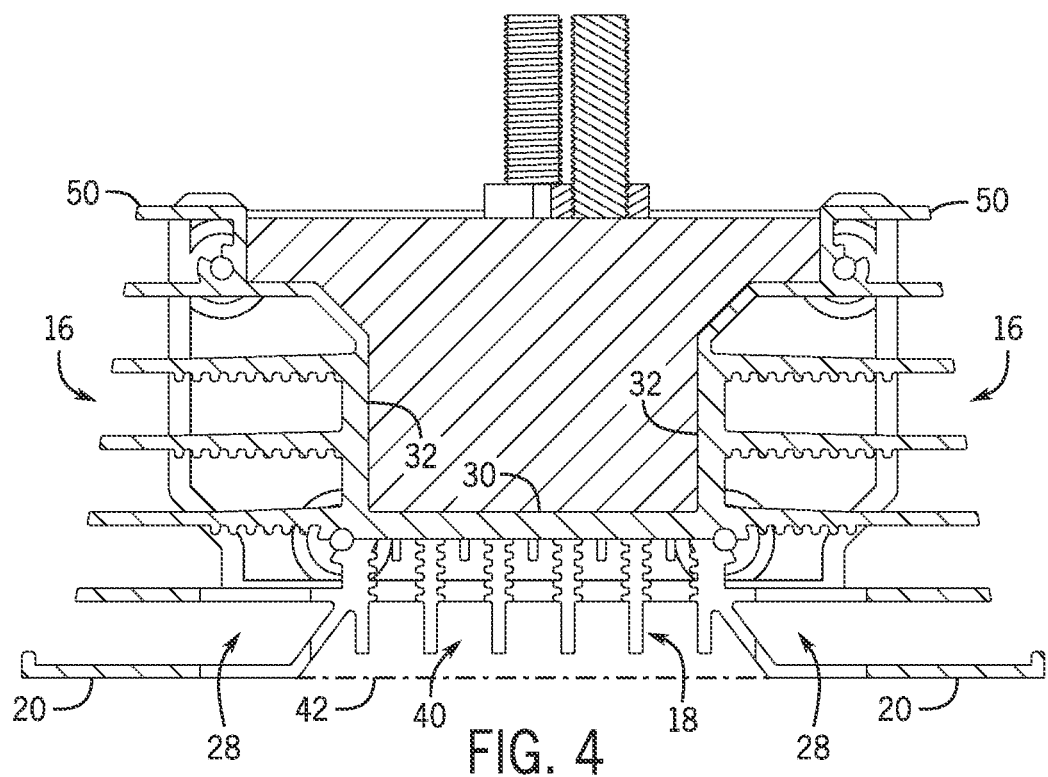
FIG. 4 illustrates another cross-sectional view of the battery isolator taken along the line 4-4 of FIG. 1.
Figure 5:
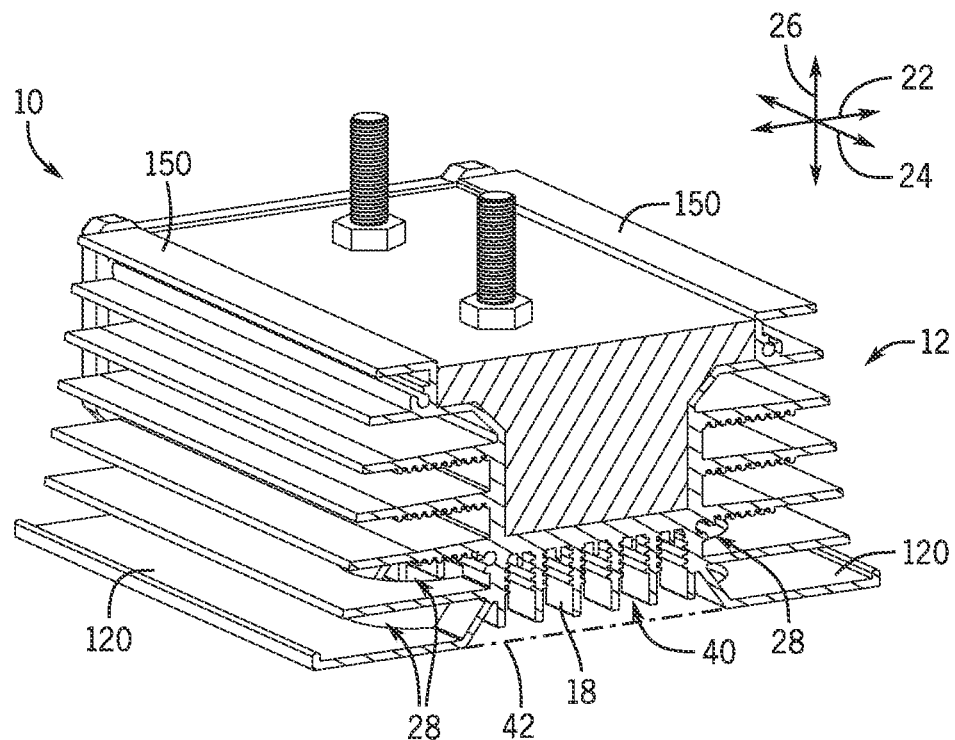
FIG. 5 illustrates yet another cross-sectional view of the battery isolator taken along the line 5-5 of FIG. 1.

As best depicted in FIGS. 2, 4, and 5, the cooling function of the chassis 12 is greatly improved by the presence of a convection chimney or slot 28 that is formed through a portion of the fins 16, 18. The slot 28 is shown to extend in the lateral direction 22 through the entirety of the bottom wall fins 18 and a portion of the sidewall fins 16. The slot 28 is further shown to extend in the vertical direction 26 through the entirety of the bottom wall fins 18 and the mounting fins 20, as well as one sidewall fin 16 located vertically above the mounting fins 20. In other implementations, the slot 28 may extend in the vertical direction 26 through additional sidewall fins 16. However, the present inventors have recognized that by refraining from extending the slot 28 in the vertical direction 26 through many or all of the sidewall fins 16, an attractive aesthetic appearance of the chassis 12 is maintained, and machining costs in fabricating the slot 28 are minimized. The dimensions that the slot 28 extends through the sidewall fins 16 in the lateral direction 22 and through the sidewall fins 16 and bottom wall fins 18 in the longitudinal direction 24 are not particularly limited, and the slot 28 may be a size that enables sufficient convective airflow around the fins 16, 18.

Figure 6:
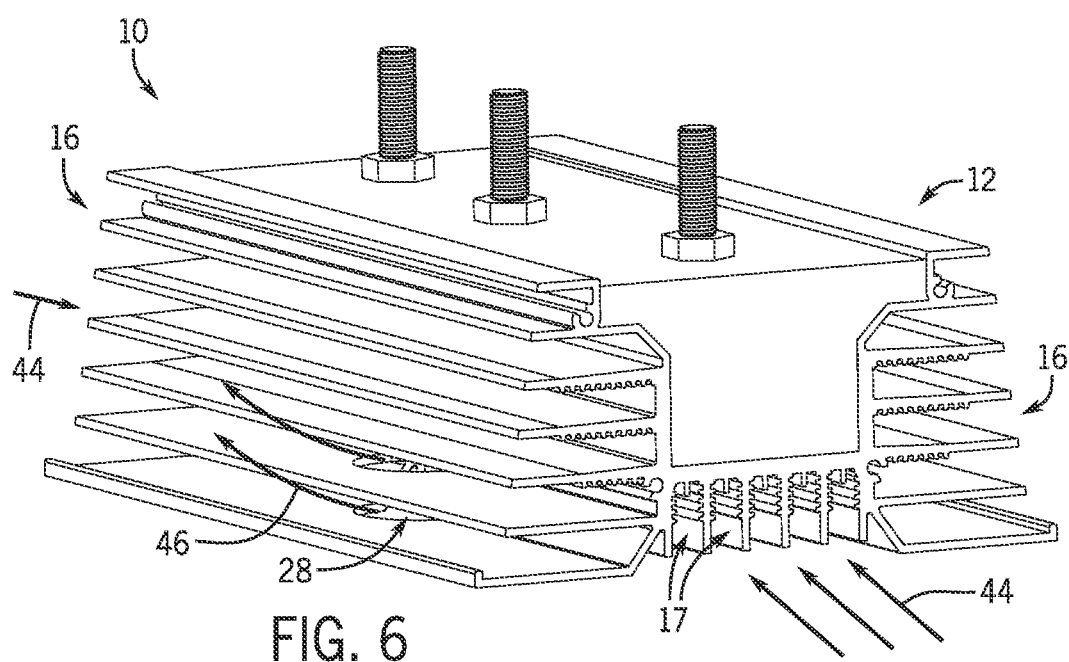
FIG. 6 illustrates an exemplary airflow pattern through the battery isolator of FIG. 1.
Figure 7:
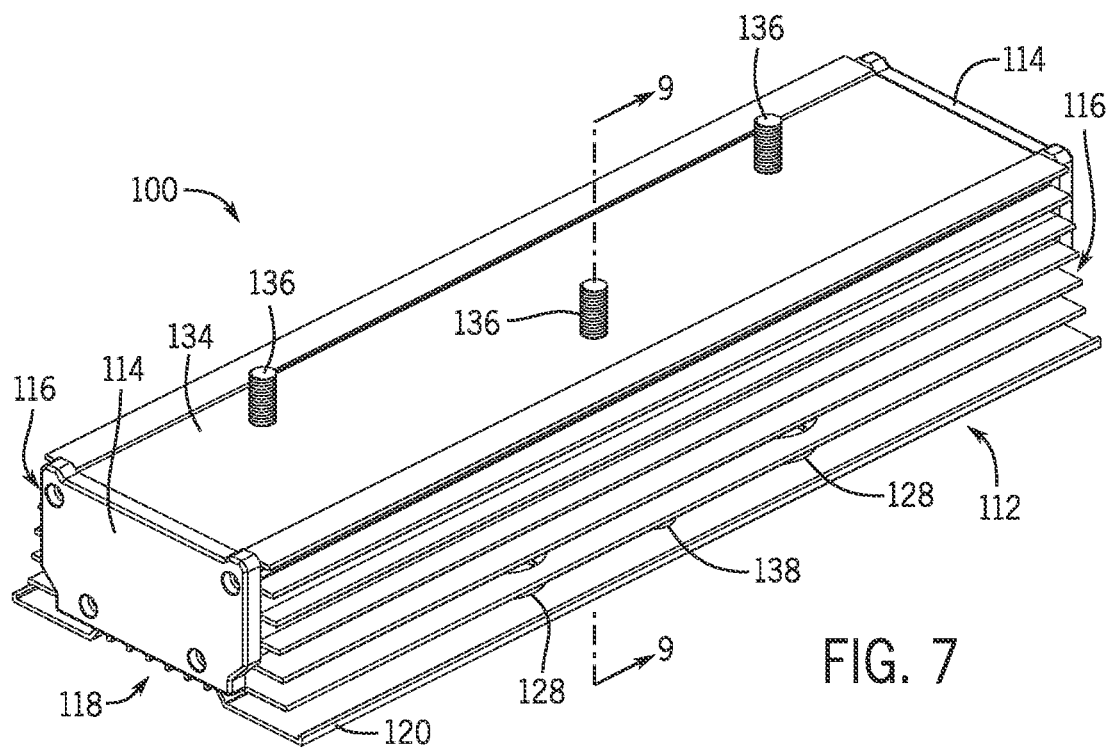
FIG. 7 illustrates a perspective view of the top of another exemplary battery isolator according to the present disclosure.
Figure 8:
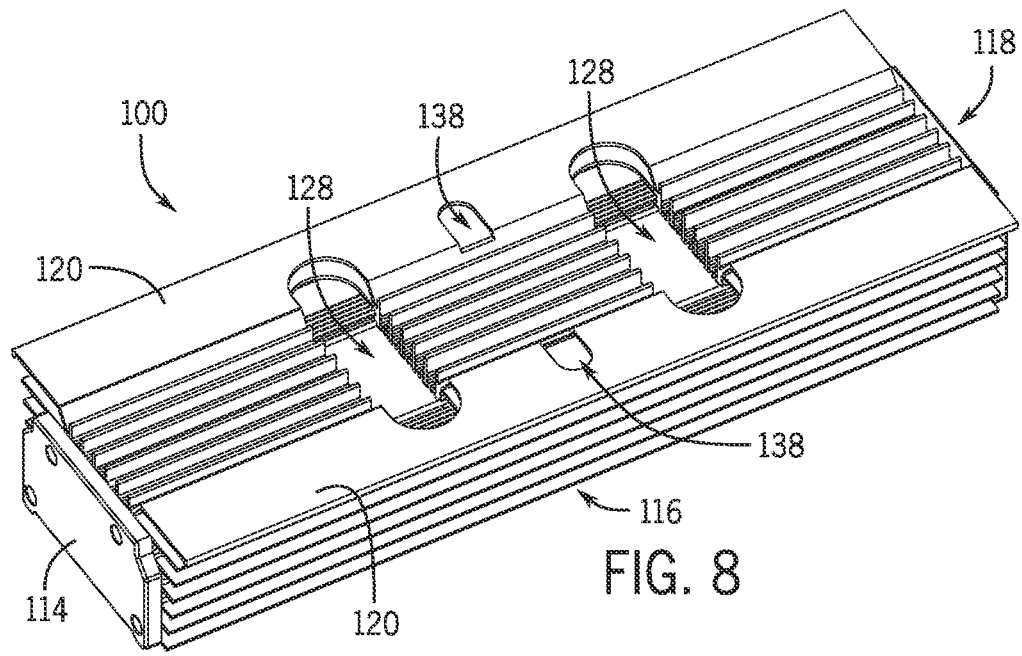
FIG. 8 illustrates a perspective view of the bottom of the battery isolator of FIG. 7.
Figure 9:
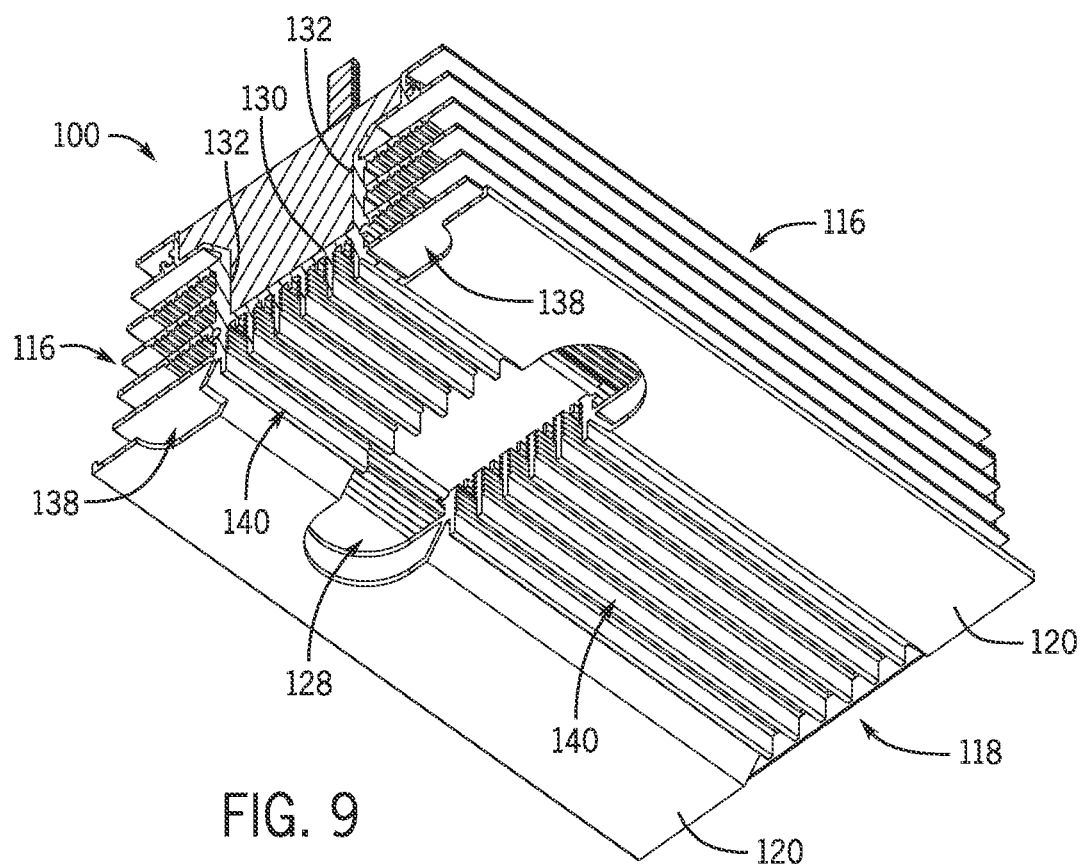
FIG. 9 illustrates a cross-sectional view of the battery isolator taken along the line 9-9 of FIG. 7.
Figure 10:
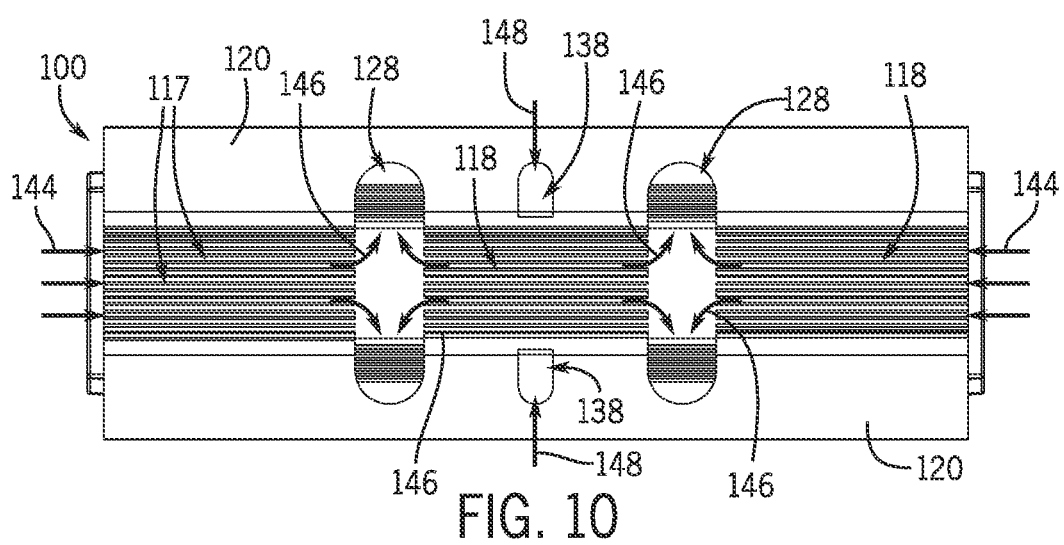
FIG. 10 illustrates an exemplary airflow pattern through the battery isolator of FIG. 7.

Turning specifically to FIG. 6, an exemplary airflow pattern facilitated by the presence of the slot 28 in the chassis 12 is depicted. As shown, relatively cooler air (indicated by arrows 44) is drawn from the front and rear of the device 10 in the longitudinal direction 24 and provides convective cooling along the bottom wall 30 and the bottom wall fins 18 as it travels through airflow channels 17 formed between pairs of fins and through the gap region 40 toward the middle of the chassis 12. Upon reaching the slot 28 in the middle of the chassis 12, the cooling air travels in the lateral direction 22 and exits the gap region 40 through the slot 28 of the chassis 12 (which slot 28 also serves as an airflow channel) as indicated by arrows 46, thereby facilitating continuous airflow and increased convective cooling past the past the fins 16, 18. Although air is shown exiting the slot 28 only on the left side of the chassis 12 in this view, air exits the slot 28 on the right side of the chassis 12 as well in a similar fashion.

Although significant improvements in convective cooling of an electronics chassis are achieved by the presence of a single slot acting as a convective chimney, greater improvement may be achieved through the presence of multiple slots, as shown by the exemplary battery isolator device 100 depicted in FIGS. 7-10. Similar to the battery isolator device 10, device 100 is shown to include a chassis 112 with multiple terminals 136 extending through a top cover 134. At either end of the chassis 112 in the longitudinal direction 24, an end cap 114 is mounted to the chassis 112 to enclose the electronic components of the isolator 100. The chassis 112 is shown to include multiple sidewall fins 116 extending from sidewalls 132 and multiple bottom wall fins 118 extending from bottom wall 130. In addition, like the bottom wall fins 18 of the chassis 12, the bottom wall fins 118 of the chassis 112 are not configured to extend to the vertical limit of the mounting fins 120. In this way, a gap region 140 is formed vertically below the bottom wall fins 118 that facilitates airflow around the fins 118.

However, rather than a single slot positioned at the midpoint of the chassis in the longitudinal direction, the chassis 112 is shown to include a pair of slots 128 (best depicted in FIGS. 8 and 10) spaced apart from each other in the longitudinal direction 24. Like the slots 28, the slots 128 may extend through the entireties of the bottom wall fins 118 and partially through the sidewall fins 116 and mounting fins 120 in the lateral and vertical directions 22, 26. The distance between the pair of slots 128 in the longitudinal direction 24 is not strictly limited, and the pair of slots 128 may be located anywhere along the chassis 112 in the longitudinal direction 24. In other embodiments, an electronic device chassis according to the present disclosure may include more than two slots 128.

In addition to the pair of slots 128, the chassis 112 is further shown to include a pair of inflow slots 138 (best depicted in FIG. 8) at the midpoint of the chassis 112 in the longitudinal direction 24. The inflow slots 138 may be configured to permit additional cooling air to enter the gap region 140 below the bottom wall fins 118 and travel in the longitudinal direction 24 before exiting through one of the pair of slots 128. Such an airflow pattern is specifically depicted in FIG. 10. As shown, cooling air (represented by arrows 144) enters the chassis 112 from the front and rear, as well as through the inflow slots 138 (represented by arrows 148). The cooling air then travels along the longitudinal direction 24 via channels 117 before exiting the chassis 112 through the slots 128, as represented by arrows 146. In contrast to the slots 128 provided for the exit of cooling air, the inflow slots 138 may not extend through the bottom wall fins 118, and may only extend through the mounting fins 120 in the vertical direction 26, and partially through the mounting fins 120 in the lateral direction 22.

Figure 11:
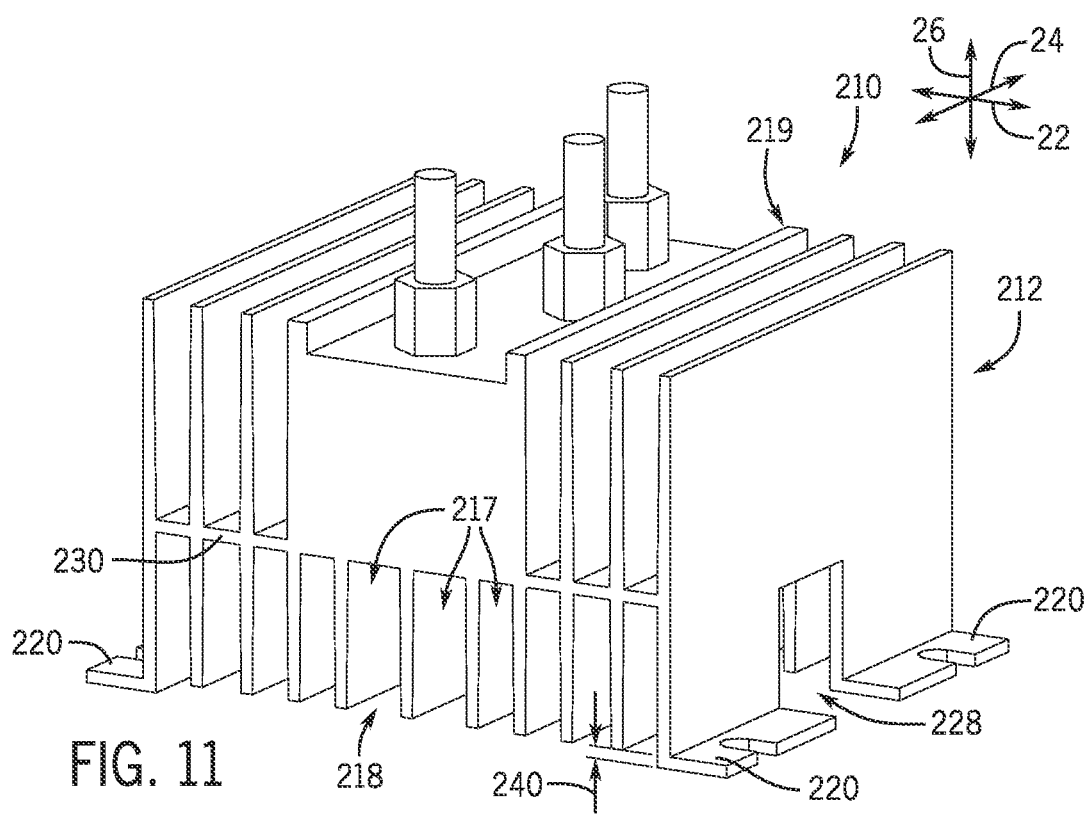
FIG. 11 illustrates a perspective view of the top of another exemplary battery isolator according to the present disclosure.
Figure 12:
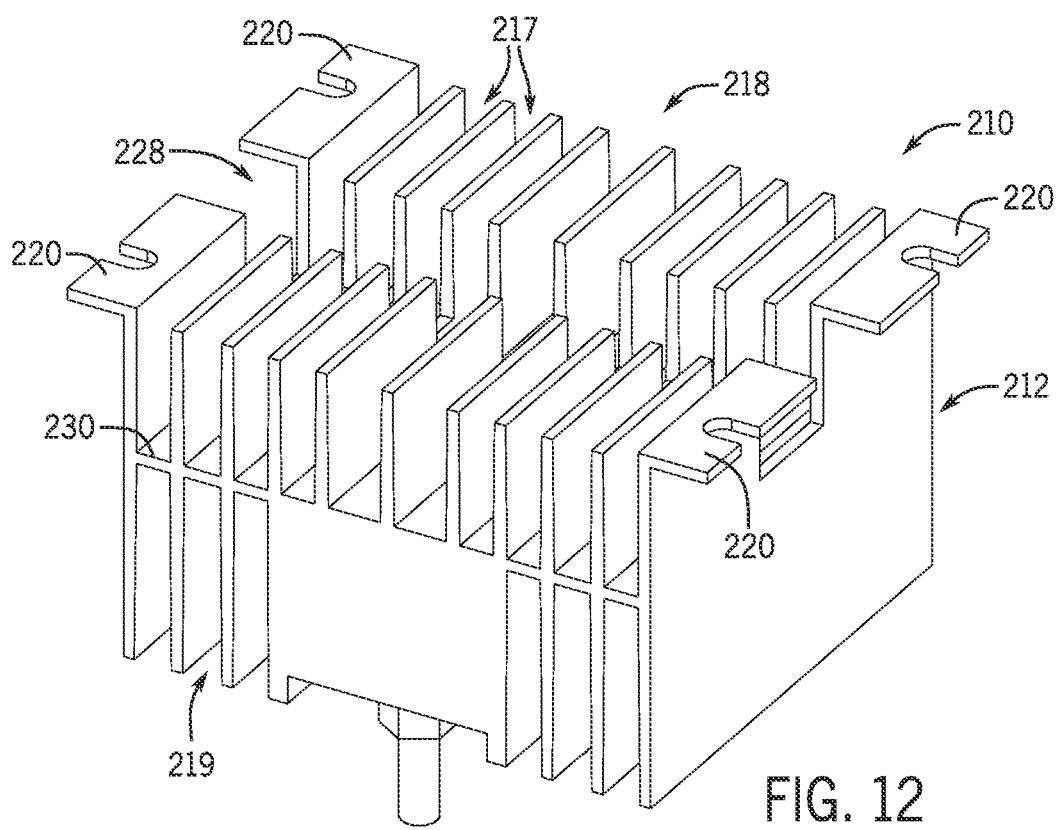
FIG. 12 illustrates a perspective view of the bottom of the battery isolator of FIG. 11.

FIGS. 11 and 12 illustrate another example of a device 210 comprising a chassis 212 having a bottom wall 230 extending in a longitudinal direction 24 and configured to hold an electronic device such as a diode-based battery isolator. In contrast to the examples of FIGS. 1-10, the example of FIGS. 11 and 12 does not include sidewall fins. Instead, the device 210 includes lower fins 218 projecting downwardly from the bottom wall 230 and upper fins 219 projecting upwardly from the bottom wall 230. As with the above examples, the bottom wall fins 218 of the chassis 212 extend some distance in the vertical direction 26, but do not fully extend to the lowermost vertical extent of the chassis 212, leaving a gap region 240 below the fins 218. A slot 228 extends in the lateral direction 22 through the lower fins 218 so as to allow air to flow along the chassis 212 in the longitudinal direction 24 in channels 217 between the fins 218 and in the lateral direction 22 through the slot 228. The slot 228 extends at least partially through the mounting fins 220 so as to allow air to exit from under the chassis 212 in the lateral direction 22. Similar benefits of enhanced cooling due to the convection chimney provided by the slot 228 are therefore realized as described hereinabove.

In exemplary implementations, chassis 12, 112, 212 is fabricated using a multi-step manufacturing process with the first step comprising an extrusion process along the longitudinal direction 24, such that the fins 16, 18, 116, 118, 218, 219 are formed along and extend in the longitudinal direction 24. Once initially formed, the slots 28, 128, 138, 228 may be formed in a secondary step using a milling process, although another formation process could be utilized.

In still further embodiments, the chassis 12, 112, 212 and slots 28, 128, 138, 228 may be formed in a single step manufacturing process. For example, the chassis 12, 112, 212 may be die-cast.

Figure 13:
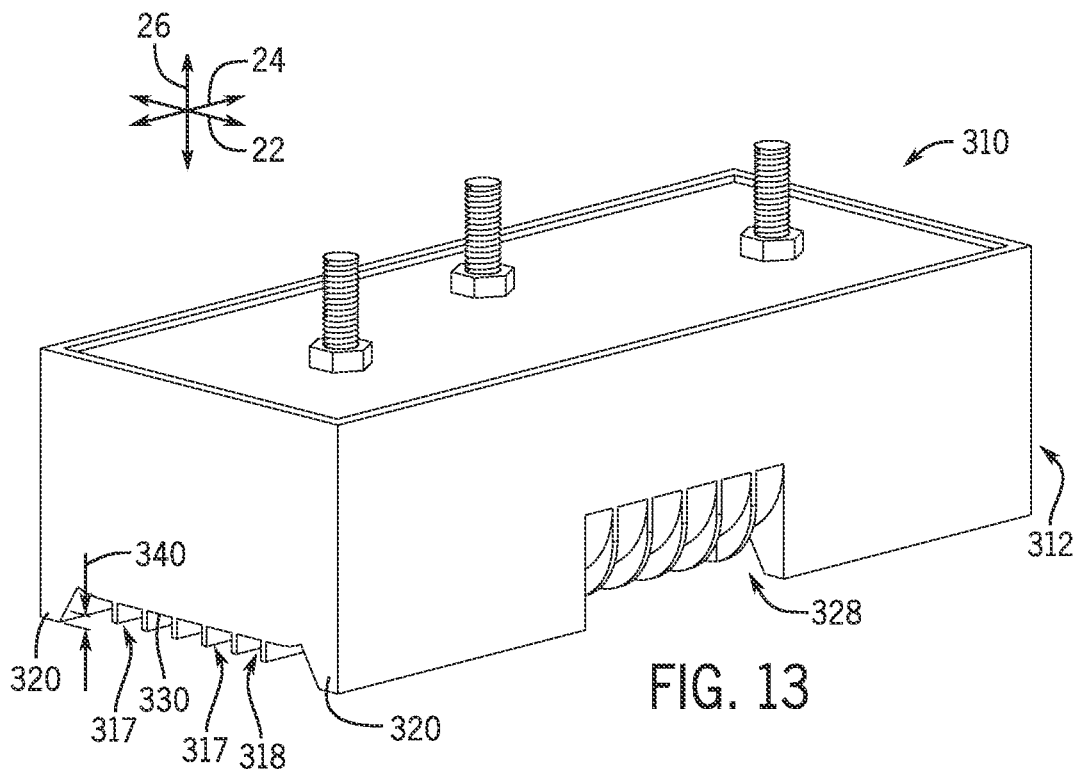
FIG. 13 illustrates a perspective view of the top of another exemplary battery isolator according to the present disclosure.
Figure 14:
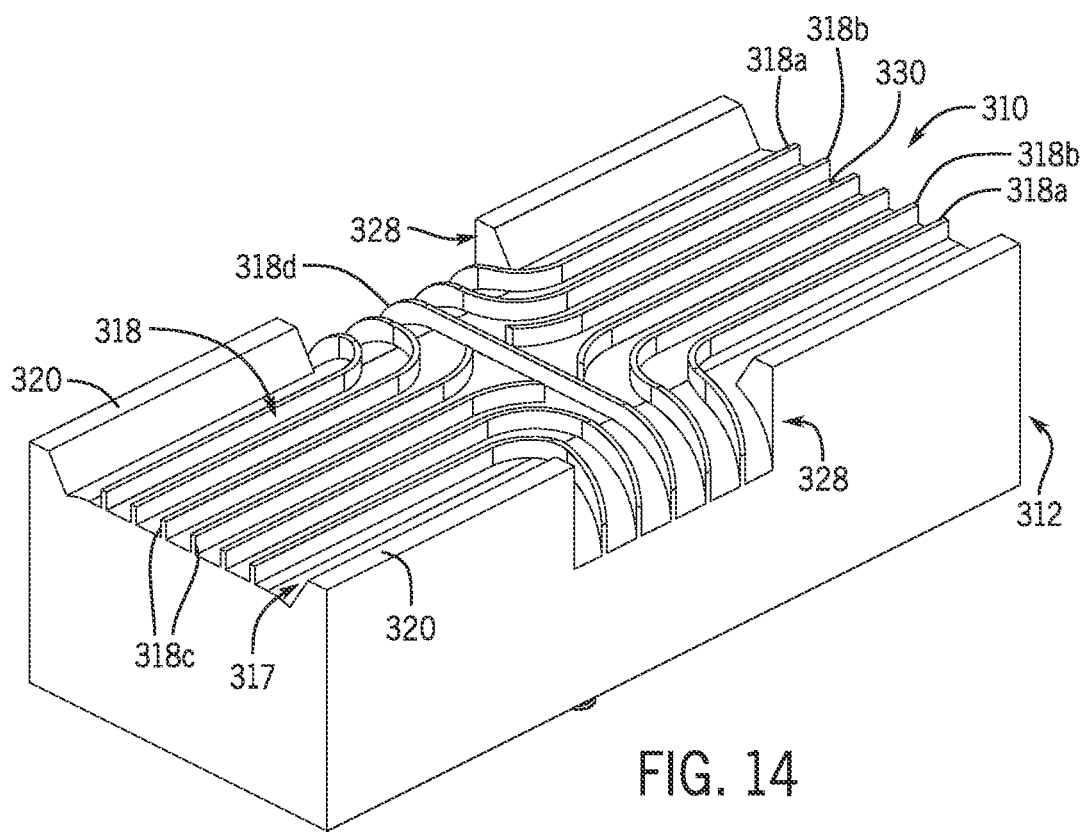
FIG. 14 illustrates a perspective view of the bottom of the battery isolator of FIG. 13.

Die-casting the chassis may provide additional benefits in that the fins are not required to be parallel along the length of the chassis. For example, FIGS. 13 and 14 show an exemplary device 310 having a chassis 312 that has been die-cast to form a bottom wall 330 having a plurality of bottom wall fins 318 projecting downwardly therefrom. As with the above examples, the bottom wall fins 318 of the chassis 312 extend some distance in the vertical direction 26, but do not fully extend to the lowermost vertical extent of the chassis 312, leaving a gap region 340 below the fins 318. Although the chassis 312 is not shown with fins on its side wall or top wall, fins could be provided on those surfaces as well. In contrast to the examples of FIGS. 1-12, the bottom wall fins 318 are not parallel to one another along the entire length of the chassis 312. Rather, about halfway along the length of the chassis 312, at least one fin in the plurality of fins 318 turns from extending in the longitudinal direction 24 to extending in the lateral direction 22. For example, as shown in FIG. 14, laterally outer fins 318*a*, 318*b* on each side of the chassis 312 curve from extending in the longitudinal direction 24 to extending more or less in the lateral direction 22, continuing all the way to the slots 328 formed in the mounting fins 320 on either side. Fins 318*c* that are situated laterally inward curve slightly from extending in the longitudinal direction 24 toward the lateral direction 22, but do not continue all the way to the slots 328. Fin 318*d* is situated about halfway along the length of the chassis 312 and extends in the lateral direction 22 only. The slots 328 and fins 318 extend slightly upwardly in the vertical direction 26 along the lateral sides of the chassis 312, guiding airflow upwards out of the channels 317 formed between pairs of fins in the plurality of fins 318. Although the fins 318 are shown as being curved as they change direction from the longitudinal direction 24 to the lateral direction 22, the change in direction could also be made at a right angle, along a series of straight line segments, at a different radius, etc.

The material of the chassis 12, 112, 212, 312 is not particularly limited, and in exemplary implementations may be aluminum due to its relatively high thermal conductivity and low weight. In other embodiments, a different material (e.g., copper, stainless steel) could be utilized.

Therefore, the present disclosure is of a chassis 12, 112, 212 for an electronic device. The chassis 12, 112, 212 extends in a longitudinal direction 24 and is defined in a lateral 22 direction perpendicular to the longitudinal direction 24. The chassis 12, 112, 212 includes a bottom surface (the underside of bottom wall 30, 130, 230) extending in the longitudinal direction 24; a first plurality of fins 18, 118, 218 projecting downwardly from the bottom surface and extending in the longitudinal direction 24, and a first slot 28, 128, 228 extending in the lateral direction 24 through the first plurality of fins 18, 118, 218 so as to allow air to flow along the chassis 12, 112, 212 in the longitudinal direction 24 in between the fins in the first plurality of fins 18, 118, 218 and in the lateral direction 22 through the first slot 28, 128, 228.

In some examples, a first fin projects outwardly from a first lateral side of the chassis 12, 112. In such an example, the first slot 28, 128 extends at least partway through the first fin.

In one example, a second fin projects outwardly from an opposite second lateral side of the chassis 12, 112. In such an example, the first slot 28, 128 extends at least partway through the second fin.

In some examples, the first fin is one of a second plurality of fins 16, 116 projecting outwardly from the first lateral side of the chassis 12, 112, the second fin is one of a third plurality of fins 16, 116 projecting outwardly from the second lateral side of the chassis 12, 112, and a lowermost fin 20, 120 in the second plurality of fins 16, 116 and a lowermost fin 20, 120 in the third plurality of fins 16, 116 are situated vertically lower than a lowermost extent of the fins in the first plurality of fins 18, 218.

In some examples, the first fin is the lowermost fin 120 in the second plurality of fins 16, 116 and the second fin is the lowermost fin 120 in the third plurality of fins 16, 116.

In some examples, the fins in the second plurality of fins 16, 116 decrease in lateral width from the lowermost fin 20, 120 to an uppermost fin 50, 150 thereof and the fins in the third plurality of fins 16, 116 decrease in lateral width from the lowermost fin 20, 120 to an uppermost fin 50, 150 thereof.

In some examples, the chassis 112 includes a second slot 128 extending in the lateral direction 22 through the first plurality of fins 118 so as to allow air to flow along the chassis 112 in the longitudinal direction 24 in between the fins in the first plurality of fins 118 and in the lateral direction through the second slot 128. In such an example, the second slot 128 is spaced apart from the first slot 128 in the longitudinal direction 24.

In some examples, the chassis 112 further includes a third slot 138 extending in the lateral direction 22 through the first plurality of fins 118. In such an example, the third slot 138 is located between the first and second slots 128, so as to allow air to flow beneath the bottom surface of the chassis 112 via the third slot 138, thereafter in the longitudinal direction 24 in between the fins in the first plurality of fins 118, and thereafter in the lateral direction 22 through the first and second slots 128.

In some examples, the first slot 28, 128, 228 extends vertically from a lowermost extent of the fins in the first plurality of fins 18, 118, 218 to the bottom surface (underside of bottom wall 30, 130, 230) of the chassis 112.

According to another example of the present disclosure, a chassis 12, 112, 212 for an electronic device is provided. The chassis 12, 112, 212 includes a bottom side (e.g., bottom wall 30, 130, 230) extending in a longitudinal direction 24 and configured to support the electronic device. The chassis 12, 112, 212 further includes a first plurality of fins 18, 118, 218 projecting downwardly from the bottom side and extending in the longitudinal direction 24 and a first slot 28, 128, 228 extending in a lateral direction 22 perpendicular to the longitudinal direction 24 through the first plurality of fins 18, 118, 218 such that the fins in the first plurality of fins 18, 118, 218 are discontinuous in the longitudinal direction 24.

In some examples, the chassis 12, 112 includes a first lateral side (e.g., sidewall 32, 132) coupled to the bottom side and extending in the longitudinal direction 24 and a second lateral side (e.g., sidewall 32, 132) coupled to the bottom side opposite the first lateral side and extending in the longitudinal direction 24. A second plurality of fins 16, 116 projects outwardly from the first lateral side and extends in the longitudinal direction 24 and a third plurality of fins 16, 116 projects outwardly from the second lateral side and extends in the longitudinal direction 24. The first slot 28, 128 extends at least partway through a fin in the second plurality of fins 16, 116 and at least partway through a fin in the third plurality of fins 16, 116.

In some examples, a lowermost fin 20, 120 in the second plurality of fins 16, 116 and a lowermost fin 20, 120 in the third plurality of fins 16, 116 are situated vertically lower than a lowermost extent of the fins in the first plurality of fins 18, 118.

In some examples, the first slot 28, 128, 228 extends vertically from a lowermost extent of the fins in the first plurality of fins 18, 118, 218 to a lower surface of the bottom side (e.g., to the underside of bottom wall 30, 130, 230) of the chassis 12, 112, 212.

In some examples, a second slot 128 extends in the lateral direction 22 through the first plurality of fins 118. In such an example, the second slot 128 is spaced apart from the first slot 128 in the longitudinal direction 24. The chassis 112 further includes a third slot 138 extending in the lateral direction 22 through the first plurality of fins 118. The third slot 138 is located between the first and second slots 128.

According to another example of the present disclosure, a chassis 12, 112, 212, 312 for an electronic device is defined in a longitudinal direction 24 and a lateral direction 22 perpendicular to the longitudinal direction 24. The chassis 12, 112, 212, 312 comprises a bottom side (e.g., bottom wall 30, 130, 230, 330) extending in the longitudinal direction 24 and the lateral direction 22 and being configured to support the electronic device. A plurality of fins 18, 118, 218, 318 projects downwardly from the bottom side, the plurality of fins 18, 118, 218, 318 defining a plurality of airflow channels 17, 117, 217, 317 therebetween. The plurality of airflow channels 17, 117, 217, 317 are configured so as to allow air to flow along the bottom side of the chassis 12, 112, 212, 312 in the longitudinal direction 24 and thereafter in the lateral direction 22.

In some examples, the plurality of channels 17, 117, 217, 317 are discontinuous in the longitudinal direction 24.

In some examples, a slot 28, 128, 228 extends in the lateral direction 22 through the plurality of fins 18, 118, 218 so as to allow air to flow in the lateral direction 22.

In some examples, at least one fin in the plurality of fins 318 turns from extending in the longitudinal direction 24 to extending in the lateral direction 22.

In some examples, the plurality of fins 18, 118, 218, 318 comprises mounting fins 20, 120, 220, 320 projecting downwardly from opposite lateral sides of the bottom side and the plurality of airflow channels 17, 117, 217, 317 extend through the mounting fins 20, 120, 220, 320.

In the above description, certain terms have been used for brevity, clarity, and understanding. No unnecessary limitations are to be inferred therefrom beyond the requirement of the prior art because such terms are used for descriptive purposes and are intended to be broadly construed. The different assemblies and methods described herein may be used alone or in combination with other assemblies and methods. It is to be expected that various equivalents, alternatives and modifications are possible within the scope of the appended claims.

What is claimed is:

1. A chassis for an electronic device, the chassis extending in a longitudinal direction and being defined in a lateral direction perpendicular to the longitudinal direction, the chassis comprising:
   a bottom surface extending in the longitudinal direction;
   a first plurality of fins projecting downwardly from the bottom surface and extending in the longitudinal direction; and
   a first slot extending in the lateral direction through an entirety of the first plurality of fins in the lateral direction so as to allow air to flow along the chassis in the longitudinal direction in between the fins in the first plurality of fins and in the lateral direction through the first slot.

2. The chassis of claim 1, further comprising a first fin projecting outwardly from a first lateral side of the chassis, wherein the first slot extends at least partway through the first fin.

3. The chassis of claim 2, further comprising a second fin projecting outwardly from an opposite second lateral side of the chassis, wherein the first slot extends at least partway through the second fin.

4. The chassis of claim 3, wherein:
   the first fin is one of a second plurality of fins projecting outwardly from the first lateral side of the chassis;
   the second fin is one of a third plurality of fins projecting outwardly from the second lateral side of the chassis; and
   a lowermost fin in the second plurality of fins and a lowermost fin in the third plurality of fins are situated vertically lower than a lowermost extent of the fins in the first plurality of fins.

5. The chassis of claim 4, wherein the first fin is the lowermost fin in the second plurality of fins and the second fin is the lowermost fin in the third plurality of fins.

6. The chassis of claim 4, wherein the fins in the second plurality of fins decrease in lateral width from the lowermost fin to an uppermost fin thereof; and
   wherein the fins in the third plurality of fins decrease in lateral width from the lowermost fin to an uppermost fin thereof.

7. The chassis of claim 1, further comprising a second slot extending in the lateral direction through the first plurality of fins so as to allow air to flow along the chassis in the longitudinal direction in between the fins in the first plurality of fins and in the lateral direction through the second slot, the second slot being spaced from the first slot in the longitudinal direction.

8. The chassis of claim 7, further comprising a third slot extending in the lateral direction through the first plurality of fins, the third slot being located between the first and second slots, so as to allow air to flow beneath the bottom surface of the chassis via the third slot, thereafter in the longitudinal direction in between the fins in the first plurality of fins, and thereafter in the lateral direction through the first and second slots.

9. The chassis of claim 1, wherein the first slot extends vertically from a lowermost extent of the fins in the first plurality of fins to the bottom surface of the chassis.

10. The chassis of claim 1, wherein the electronic device is a battery isolator.

11. A chassis for an electronic device, the chassis comprising:
    a bottom side extending in a longitudinal direction and configured to support the electronic device;
    a first plurality of fins projecting downwardly from the bottom side and extending in the longitudinal direction; and
    a first slot extending in a lateral direction perpendicular to the longitudinal direction and through the first plurality of fins such that the fins in the first plurality of fins are discontinuous in the longitudinal direction and configured to direct a flow of air from the longitudinal direction to the lateral direction and to the bottom side of the chassis.

12. The chassis of claim 11, further comprising:
    a first lateral side coupled to the bottom side and extending in the longitudinal direction;
    a second lateral side coupled to the bottom side opposite the first lateral side and extending in the longitudinal direction;
    a second plurality of fins projecting outwardly from the first lateral side and extending in the longitudinal direction; and
    a third plurality of fins projecting outwardly from the second lateral side and extending in the longitudinal direction;
    wherein the first slot extends at least partway through a fin in the second plurality of fins and at least partway through a fin in the third plurality of fins.

13. The chassis of claim 12, wherein a lowermost fin in the second plurality of fins and a lowermost fin in the third plurality of fins are situated vertically lower than a lowermost extent of the fins in the first plurality of fins.

14. The chassis of claim 11, wherein the first slot extends vertically from a lowermost extent of the fins in the first plurality of fins to a lower surface of the bottom side of the chassis.

15. The chassis of claim 11, further comprising:
    a second slot extending in the lateral direction through the first plurality of fins, the second slot being spaced from the first slot in the longitudinal direction; and
    a third slot extending in the lateral direction through the first plurality of fins, the third slot being located between the first and second slots.

16. A chassis for an electronic device, the chassis being defined in a longitudinal direction and a lateral direction perpendicular to the longitudinal direction, the chassis comprising:
    a bottom side extending in the longitudinal direction and the lateral direction and being configured to support the electronic device; and
    a plurality of fins projecting downwardly from the bottom side, the plurality of fins defining a plurality of airflow channels therebetween;
    wherein the plurality of airflow channels are configured so as to allow air to flow along the bottom side of the chassis in the longitudinal direction and thereafter through the plurality of airflow channels in the lateral direction.

17. The chassis of claim 16, wherein the plurality of airflow channels are discontinuous in the longitudinal direction.

18. The chassis of claim 16, wherein a slot extends in the lateral direction through the plurality of fins so as to allow air to flow in the lateral direction.

19. The chassis of claim 16, wherein at least one fin in the plurality of fins turns from extending in the longitudinal direction to extending in the lateral direction.

20. The chassis of claim 16, wherein the plurality of fins comprises mounting fins projecting downwardly from opposite lateral sides of the bottom side; and
   wherein the plurality of airflow channels extend through the mounting fins.

\* \* \* \* \*